July 5, 1966 J. VILCANS 3,259,847

MULTI-IDLER PARAMETRIC AMPLIFIER
WITH LOWER FREQUENCY PUMP

Filed June 22, 1964 5 Sheets-Sheet 1

INVENTOR.
JANIS VILCANS

BY

Philip J. McFarland
ATTORNEY

July 5, 1966 J. VILCANS 3,259,847

MULTI-IDLER PARAMETRIC AMPLIFIER WITH LOWER FREQUENCY PUMP

Filed June 22, 1964 5 Sheets-Sheet 2

INVENTOR.
JANIS VILCANS

BY

Philip J McFarland
ATTORNEY

INVENTOR.
JANIS VILCANS
BY
Philip J. McFarland
ATTORNEY

July 5, 1966

J. VILCANS 3,259,847

MULTI-IDLER PARAMETRIC AMPLIFIER
WITH LOWER FREQUENCY PUMP

Filed June 22, 1964

5 Sheets-Sheet 4

INVENTOR.
JANIS VILCANS

BY

Philip McFarland
ATTORNEY

July 5, 1966 J. VILCANS 3,259,847

MULTI-IDLER PARAMETRIC AMPLIFIER
WITH LOWER FREQUENCY PUMP

Filed June 22, 1964 5 Sheets-Sheet 5

INVENTOR.
JANIS VILCANS

BY

Philip McFarland
ATTORNEY 3,259,847
Patented July 5, 1966

3,259,847

MULTI-IDLER PARAMETRIC AMPLIFIER WITH LOWER FREQUENCY PUMP

Janis Vilcans, Chelmsford, Mass., assignor to Laboratory for Electronics, Inc., Boston, Mass., a corporation of Delaware Filed June 22, 1964, Ser. No. 376,826
5 Claims. (Cl. 330—4.9)

This invention pertains generally to electrical signal amplifiers and particularly to parametric amplifiers for microwave signals which utilize a pump signal having a frequency lower than the frequency of the microwave signal to be amplified.

It is known in the art, as shown by the application for a U.S. patent, Serial #207,531, filed July 5, 1962, and now abandoned, by Harley B. Henning and entitled, Parametric Amplifier (which application is assigned to the same assignee as this application), that a multi-idler parametric amplifier using a variable impedance element, as a semi-conductor diode, may be operated with a pump frequency lower than the frequency of a microwave signal to be amplified. Such an amplifier is extremely useful when the wavelength of the signal being amplified lies in the millimeter range of the electromagnetic spectrum, since, as is known, the power requirement of the pump in a parametric amplifier increases as a function of the square of its frequency and in accordance with the type of the varactor junction used.

It has been found that, in any known multi-idler parametric amplifier operating in the millimeter range, the losses inherent in the required circuitry make satisfactory operation difficult to attain. It has also been found that adequate isolation between the various required signals is extremely difficult to attain. The difficulty derives from the fact that the quality factor (or "Q") of the resonators used in the circuitry is rather critical. On the one hand the Q must be high enough to avoid spurious signals, unwanted modes of the desired signals or overlap between the various frequencies but, on the other hand, the Q must be low enough to provide sufficient bandwidth to permit adjustment or tuning.

Therefore it is a primary object of this invention to provide an improved multi-idler parametric amplifier which is particularly well adapted to amplify efficiently, conveniently and as a low noise device microwave signals in the millimeter range.

Another object of this invention is to provide an improved parametric amplifier in which losses are kept at a minimum.

Still another object of this invention is to provide an improved parametric amplifier wherein adequate isolation between the various required signals is easily attained.

A still further object of this invention is to provide an improved parametric amplifier which may be adjusted to change the band of frequencies amplified.

These and other objects of this invention are attained generally by providing a double-idler parametric amplifier in which different, independently tunable, portions of a single resonator support standing electric and magnetic fields at the frequency, respectively, of a microwave signal to be amplified, a pump signal and a first and a second idler signal, each of the cited signals being coupled to a varactor to effect the desired parametric amplification. For a more complete understanding of this invention, reference is now made to the following description of differing embodiments of parametric amplifiers according to this invention and illustrated in the attached drawings, in which:

Figure 1:
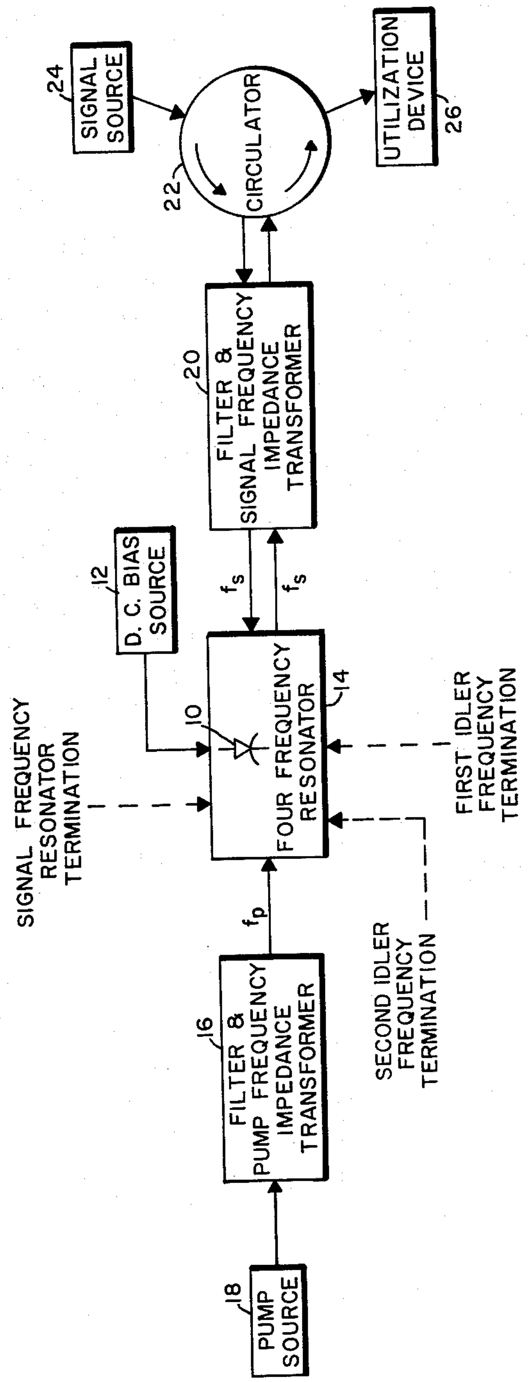
FIG. 1 is a block diagram showing the general layout of an amplifier according to this invention.

Referring now to FIG. 1, it may be seen that the amplifying portion of a parametric amplifier according to this invention comprises a diode having a non-linear variable capacitance when subjected to a time-varying signal, as a varactor 10, biased by a voltage from a conventional D.C. bias source 12 and mounted in a four frequency resonator 14. The latter element (as will become clear hereinafter) is adapted to resonate at a signal frequency, $f_s$, a pump frequency, $f_p$, a first idler frequency, $f_1$ (or $f_s-f_p$) and a second idler frequency, $f_2$ (or $2f_p-f_s$), where $f_s>f_p>f_2>f_1$, and $f_s>f_p>f_s/2$. Required elements, ancillary to amplification of a signal, are connected, as shown, to the four frequency resonator 14 to introduce signals at $f_s$ and $f_p$ and to extract an output signal. Thus, a filter and pump frequency impedance transformer 16 (hereinafter sometimes referred to as a "pump impedance transformer" and described in detail hereinafter) is disposed between a pump source 18 and the four frequency resonator 14, and, a filter and signal frequency impedance transformer 20 (hereinafter sometimes referred to as a "signal impedance transformer") is disposed between a conventional circulator 22 so that a signal source 24 and a utilization device 26 may be connected in circuit with the four frequency resonator 14.

In a practical working parametric amplifier for amplifying a 35 gc. signal, the following just-mentioned elements which are conventional may be used:

Varactor 10—Micro State Electronics Corp., Murray Hill, New Jersey, gallium-arsenide varactor, type MS-4407, or equivalent;

D.C. bias source 12—adjustable negative 6 volts D.C. supply;

Pump source 18—Varian Associates, Palo Alto, California, reflex klystron, type VA277, or equivalent;

Circulator 22—Ferrotec Inc., Newton, Mass., circulator type T257, or equivalent;

Signal source 24—Alfred Electronics, Palo Alto, California, sweep generator, type 605–12018 adjusted to feed a Hewlett-Packard Company, Palo Alto, California, frequency doubler, type HP940A, or equivalent; and Utilization Device 26, Airborne Instruments Laboratory, Deer Park, New York, AIL Receiver type 132; and Mixer-preamplifier Mode KDH3, LEL, Inc., Copiague, L.I., New York;

Local oscillator—Varian Associates, Palo Alto, California, VA-97 or Hewlett-Packard Company, Palo Alto, California, broad band detector, type HPR 422A feeding a Tektronix, Inc., Portland, Oregon oscilloscope, type 531A, or equivalent.

When an amplifier using the just-named components was operated at room temperature in the circuit of FIG. 1, it was found that a 35 gc. signal could be amplified using a pump frequency of 29 gc. Thus, the results of tests were:

Gain—greater than 40 db

Bandwidth—approximately 400 mc. at 12 db gain

Noise figure—10.9 db at 17 db gain (includes utilization device); 7.6 db at 6 db gain (amplifier alone);

Tuning range—±1 gc.

In addition to the main elements listed above, appropriate monitoring and, when required, attenuators (not shown) would be added to control the relative amplitudes of the pump and signal channels. Further, it is evident that the signal source could very well be a radar working at 35 gc. for conventional or radiometry applications and the described parametric amplifier would then be a pre-amplifier in the receiver portion of such radar. In this connection it should be noted that the alternative embodiment of this invention shown in FIG. 6 could be used as a pre-amplifier and a down converter in a radar receiver.

Referring now to FIGS. 2 and 3A through 3D, the physical structure of the four frequency resonator 14 of FIG. 1 and the typical fields therewithin may be seen. Thus, it may be seen that the four frequency resonator is a length of ridge guide 30 formed by joining (as by soldering) an upper section 31 to a lower section 32 in combination with a cylindrical, coaxial cavity (unnumbered) in the upper section 31. Preferably, but not necessarily, the sections 31, 32 are fabricated from a material having a low temperature coefficient, and low cavity surface current losses, as any known iron-nickel alloy, with at least the surfaces defining the ridge guide 30 and the cylindrical cavity coated with a conductive material, as silver. The end surfaces of the upper and lower sections 31, 32 are adapted, as by tapped holes as shown at 31*a*, 32*a* and locating holes (not shown) to be connected on the one side with the pump impedance transformer 16 and on the other side with the signal impedance transformer 20 of FIG. 1, thereby serving as input ports for the pump and signal frequencies. The dimensions of the ridge guide 30 are dictated by the frequency of the signal input and the choice made of the frequency of the pump signal and the first and second idler frequencies. That is, for reasons which will become clear hereinafter, the ridge guide 30 must be of such dimensions as to support propagation of the signal frequency $f_s$, the pump frequency, $f_p$, and the second idler frequency, $2f_p-f_s$, and to cut-off the first idler frequency, $f_s-f_p$. It should be noted in passing, however, that it is not essential to the invention that a section of ridge guide be used. It is necessary only that the dimensions of any resonator used be such as to be the equivalent of the ridge guide. An alternative approach would be mode conversion for achieving all frequency coupling to the diode and isolation, changing from rectangular basic mode to circular electric or magnetic modes thus avoiding multimode resonance. The upper and lower sections 31, 32 are each also shaped to permit mounting of a varactor 10′ and to accommodate various tuning and biasing means now to be described. Thus, coaxial holes (unnumbered) are bored through the upper and lower sections 31, 32. The lower portion of the bored hole in the lower section 32 is tapped and formed to receive an adjustable, lower varactor holder 34 which is clamped, or in electrical contact, as shown, over one electrode of the varactor 10′. A combined upper varactor holder, varactor biasing voltage conductor and adjustable termination assembly 35 is fitted into the bored hole in the upper section 31. The just-named assembly includes a metallic shaft 36 fixedly mounted centrally of the hole bored in the upper section 31, being engaged in an internal thread (not shown) in a plate 39, then through the hole in ring 38 (fabricated from a microwave frequency absorbing material). Plate 39 is insulated from the upper section 31 by a sheet of insulating material 37 mounted between the plate 39 and the upper section 31 and fastened by insulating screws.

The lower end of the metallic shaft 36 is formed to receive the upper electrode of the varactor 10′. A metallic ring 40, having an outside diameter slightly less than the diameter of the hole bored in the upper section 31, is pressed on the lower end of the metallic shaft 36 and a dielectric ring 41, in turn, is pressed over the metallic ring 40 to fill the space between the wall of the hole bored in the upper section 31 and the metallic ring 40. The bottom of the upper electrode of the varactor 10′, the metallic ring 40 and the dielectric ring 41 preferably are flush with the upper surface of the ridge guide 30. The thickness of the metallic ring 40 and the dielectric ring 41 are approximately one quarter wave length of the signal of the lowest frequency ($2f_p-f_s$) in the ridge guide 30 to effect choking of such signal and of all higher frequencies. It is not, however, absolutely necessary that the dielectric ring 41 be used, since the thickness of the metallic ring 40 could be changed to effect radio frequency choking. In any event, however, the dimensions of the upper electrode of the varactor 10′, the metallic ring 40 and the dielectric ring 41 are such that the just-named elements allow only the first idler frequency, $f_s-f_p$, to pass between the ridge guide 30 and the hole bored in the upper section 31.

The threaded upper portion of the metallic shaft 36 supports a mating adjustment nut 42 captured in a slot in a block 43 which is slidably mounted on a pair of posts 44 affixed to and projecting upwardly from the plate 39. It may be seen, therefore, that rotation of the adjustment nut 42 causes movement of the block 43 upwardly or downwardly without causing any forces tending to move the metallic shaft 36. A pair of depending posts 45 are affixed to the block 43 to pass through holes (unnumbered) in the insulator ring 38 and to join with a terminating plug 46 which is slidably mounted around the metallic shaft 36 in the hole bored in the upper section 31. The material of the terminating plug 46 preferably is anodized aluminum. A terminal 47 is formed on the upper end of the metallic shaft 36. Thus, a biasing voltage (as from the D.C. bias source 12 of FIG. 1) may be applied to the varactor 10′ and length of the cylindrical cavity may be adjusted as desired.

A slot 48, extending across the width of the ridge guide 30, is formed in the upper section 31. The width of the slot 48 is such as to permit only the signal of highest frequency ($f_s$) in the ridge guide 30 to be propagated therein. In other words, the slot 48 acts as a band rejection filter for the signal frequency, but frequencies below cut-off are not materially affected. The end portion of the slot 48 removed from the ridge guide 30 supports a movable terminating bar 49. This latter element preferably is dimensioned to coact with the walls of the slot 48 as a contacting or non-contacting short, thus making it possible to adjust the length of the slot 48. As a result, then, the movable terminating bar 49 may be so positioned that, for the highest freqency in the ridge guide 30 ($f_s$), the impedance at the junction of the slot 48 and the ridge guide 30 is extremely high (thus effectively providing open circuit at frequency $f_s$) while the lower frequencies ($f_p$ and $f_{2p}-f_s$) may pass the slot 48. To complete the four frequency resonator, a hole (unnumbered) is bored in the lower section 32 to the right of the slot 48 and opening on the side wall of the ridge guide 30. This hole accommodates a tuning plug 50 affixed to a threaded shaft 51, as shown.

It will be noted that the length of the ridge guide 30 and the position of the varactor 10′, the slot 48 and the tuning plug 50 are dependent upon the frequencies of the signal to be amplified, the pump source, and the second idler frequencies. In the first instance, the length of the ridge guide 30 should be selected to support, between the two ports thereto, standing waves of any preselected mode of the lowest frequency therein. In this case, the lowest frequency is the second idler frequency. The electrical length of the ridge guide 30 (or parts thereof) may then be shortened for signals at $f_s$ and $f_p$ so that standing waves exist at least at the varactor 10'.

Figures 3A, 3B, 3C, 3D:
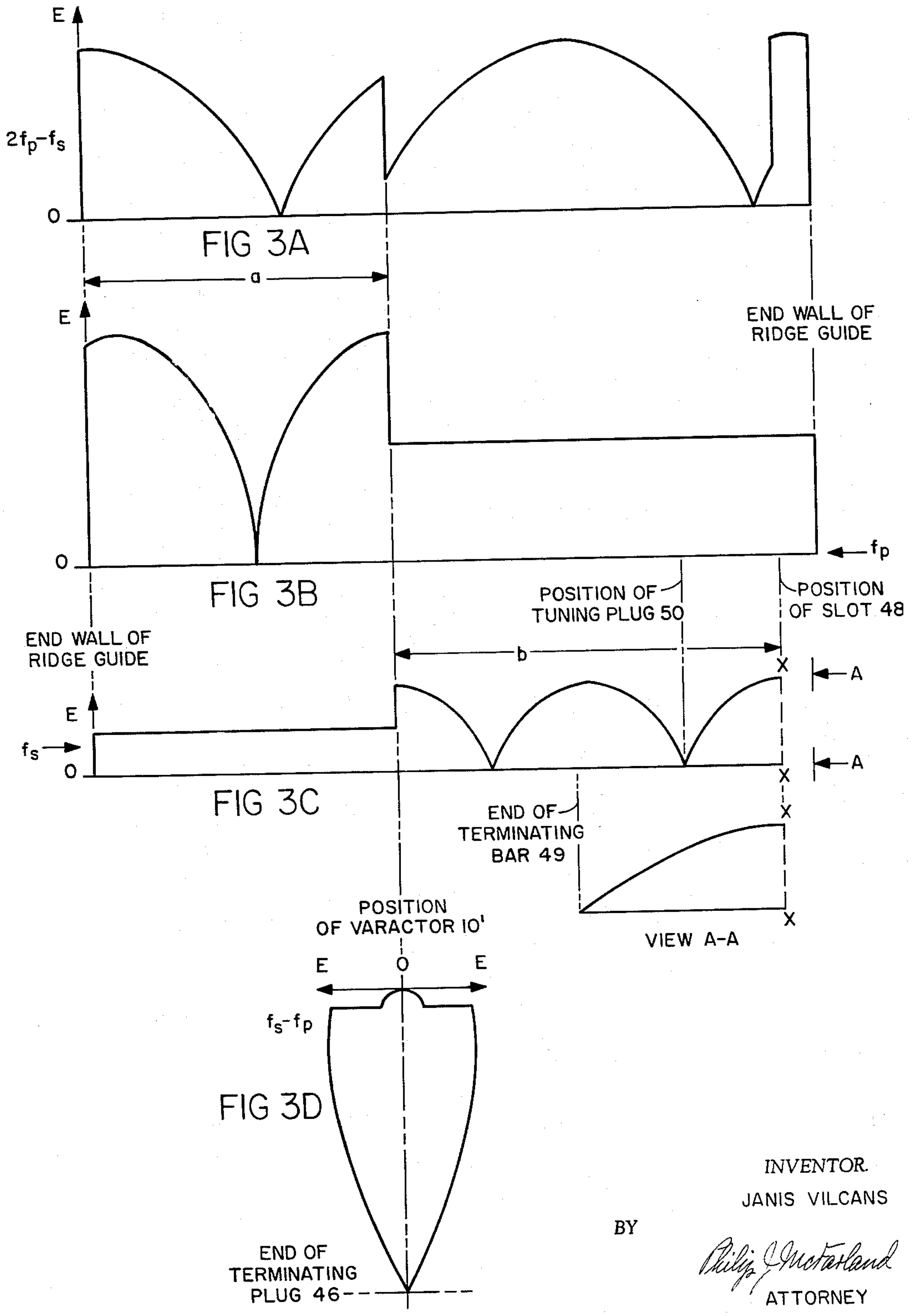
FIGS. 3A through 3D are sketches showing exemplary electric fields existing within the resonator of FIG. 2 illustrating one mode of operation of the contemplated amplifier.

In a practical embodiment of this invention, it is necessary only that the distance between the varactor 10' and one end wall (meaning, for convenience, a junction between the ridge guide 30 and, respectively the pump frequency impedance transformer 16 and the signal frequency impedance transformer 20 of FIG. 1) be fixed so that a standing wave at the pump frequency exist between the varactor 10' and the selected end wall. Obviously, however, the distance cannot be such that a null in the standing wave exists at the varactor 10'. The distance *a* of the FIG. 3B illustrates the foregoing. That is, the distance *a* preferably is slightly greater than one-half a wavelength of the pump frequency in the ridge guide 30. Consequently, the "pump" field at the varactor 10' is approximately a maximum and pump power is coupled thereto. It will be immediately obvious that the amount of pump power may be changed as desired within extremely wide limits for best operation.

The distance *b* between the varactor 10' and the slot 48 is fixed so that it is approximately equal to an even integral number of quarter wavelengths, in the ridge guide 30, of the signal frequency. Thus, when the terminating bar 49 is adjusted so that a quarter wavelength (or an odd integral number thereof) of the signal frequency exists in the slot 48 the signal frequency is coupled to the varactor. It should be noted that, even though the signal frequency, perforce, is constant, its wavelength differs in the slot 48 from its wavelength in the ridge guide 30. Therefore, a quarter wavelength of the signal frequency, as shown in view A—A of FIG. 3C is longer than a quarter wavelength of the signal in the ridge guide 30. Adjustment of the end of the terminating bar 49, then, makes the coupling between the varactor 10' and the signal frequency optimum.

A standing wave at the idler frequency, $2f_p - f_s$, is also supported in the ridge guide 30. This waveform is shown in FIG. 3A. The length of the ridge guide 30 is such that, in an ideal case, the ridge guide 30 is naturally resonant at the second idler frequency. Adjustment must be made, however, to compensate for the fact that perturbations, such as the ports and the slot 48 and the varactor 10' exist. In the illustrated embodiment such adjustment is effected by placing the tuning plug 50 at a point where the signal frequency standing field is at a null. It follows, then, that adjustment of such plug affects only the standing field at $f_2$. It should be noted, however, that it is not essential to the invention to position the tuning plug 50 at a null in the signal standing field. As a matter of fact, it is desirable (when broad-band tuning is desired) to position the tuning plug 50 at a point where it affects both the signal and the second idler standing fields.

The standing field at the first idler frequency $f_s - f_p$ is shown in FIG. 3D. It may be seen from the figure that the hole bored in the upper section 31 of FIG. 2, constitutes a resonator at the first idler frequency. Thus, the electric field at the surface of the terminating plug 46 is a minimum, so the fact that such surface preferably is anodized introduces no appreciable loss. The combination of the metallic ring 40 and the dielectric ring 41, at the first idler frequency, constitute a capacitance, while the ridge guide 30 (which is dimensioned so as to be beyond cut-off of the dominant mode of the signal being discussed) constitutes an inductance. It may be seen that the two parameters may have such relative magnitude as to constitute a resonance condition with the varactor 10' which in effect terminates the coaxial cavity.

Referring now to FIGS. 3B and 3C, it may be seen that the signal and pump frequencies set up standing waves in mutually exclusive portions of the ridge guide 30. To put it another way, the impedance of the ridge guide 30, looking from the varactor 10', is substantially matched (at the signal frequency, $f_s$) to the impedance at the signal input port. At the same time, the impedance of the ridge guide 30, looking from the varactor 10', is substantially matched (at the pump frequency, $f_p$) to the impedance at the pump input port.

Referring now to FIG. 3(A) it may be seen that, at the second idler frequency, $2f_p - f_s$, the pump and signal input ports are dimensioned so as to cut-off the second idler frequency. Such conditions are required to prevent leakage of the second idler signal and to ensure proper coupling between that signal and the varactor 10'.

Figure 4:
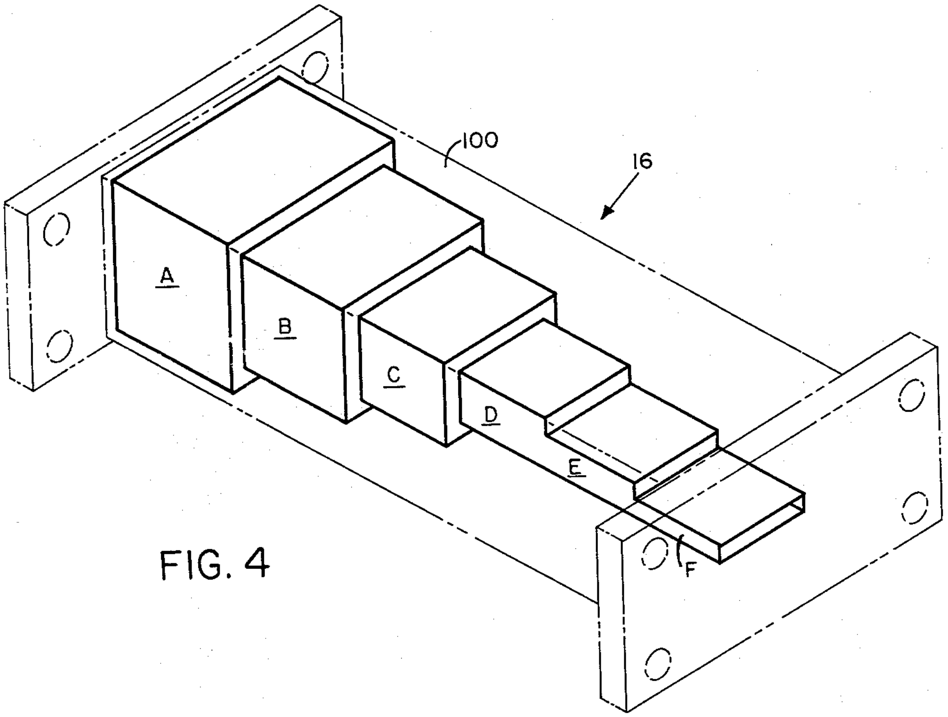
FIG. 4 is an isometric view, partially in phantom, showing pertinent details of the contemplated filter and impedance transformers of FIG. 1.

The design features, as shown in FIG. 4, of the pump impedance transformer 16 permit that element simultaneously to operate as a high pass filter (by reflecting the second idler signal without loss) an impedance matching device (to match the pump and signal sources to the ridge guide 30) and, additionally, as a coupler between conventional waveguide and the pump input port in the four frequency resonator. Thus, for example, it may be seen that the pump impedance transformer 16 comprises a section of step guide 100 having integrally attached flanges as shown and internal steps, labelled A, B, C, D, E and F. Step A (which may be omitted without affecting the operation of the transformer) is dimensioned to match the dimensions of the waveguide to which it is coupled. Steps A, B, C, and D are so proportioned that each step presents the same matched impedance to the pump signal. At the same time, the decreasing width of each successive one of the steps B, C, D effects a change in the transmission path for the pump signal from the width of the waveguide **18*a* to the width of the pump input port to the ridge guide 30**.

Steps E, F constitute the impedance transforming portions of the pump impedance transformer. Each of these steps has the same width as step D but decreases in height so that the dimensions of step F are the same as the dimensions of the pump input port of the four frequency resonator 14 of FIG. 1. Consequently, the impedance of each step decreases to effect the desired impedance transformation. Further, the constant width sections D, E, F constitute a high pass filter which cuts off all frequencies in the ridge guide at the port adjacent the step F which are below the cut-off frequency of that section.

It will be apparent immediately to a person of skill in the microwave art that the illustrated pump impedance transformer may be changed as required as conditions change. That is, the dimensions of the various steps are dependent upon the dimensions of the elements to be connected, the impedances to be matched and the desired cut-off frequency. Thus, the impedance of each step may be calculated in accordance with the formula:

$$Z_n = 754\frac{b_n}{a_n}\left[1-\left[\frac{d}{2a_n}\right]^2\right]^{-\frac{1}{2}} \qquad (1)$$

where $b_n$=the height of the $n^{th}$ step
$a_n$=the width of the $n^{th}$ *step*
$d$=the wavelength, in free space, of the signal being transformed.

The constant impedance steps (as steps B, C, D) may be determined by imposing the condition that the impedance of each step is the same and by applying the binomial transformer design equations $$4d_B^2 = 3d_A^2 + d_D^2 \qquad (2)$$
$$4d_C^2 = 3d_D^2 + d_A^2$$

where $d_A$, $d_B$, $d_C$ and $d_D$ equal the wavelength, in the steps A, B, C, D, of the signal being transformed.

The length of each constant impedance step (after step A) preferably is set at one quarter the wavelength of the signal in each such step.

The impedance of the steps E, F may be determined, in any given case, by the method described by L. Young in the article entitled, "Stepped-Impedance Transformers and Filter Prototypes," published in the IRE Transactions on Microwave Theory and Techniques, vol. MTT–10, No. 5, pp. 39–359, September 1962. At the same time correction may be made for the susceptance for the step junctions between adjacent sections and steps E and F.

The attenuation, in db, of the constant width section of the pump impedance transformer 16 to any signal below its cut-off may be calculated by the following formula:

$$\text{Attenuation (db)}=8.686\left[\frac{\pi L}{a}\right]\left[1-\left(\frac{2a}{d}\right)^2\right]^{\frac{1}{2}} \quad (3)$$

where $a$=the width of the constant width steps;
$d$=the wavelength of the applied signal; and
$L$=the total length of the constant width section.

It should be noted here that it is not required that the impedance of the last step in the pump frequency transformer be the same as the impedance of the pump input port. As a matter of fact, it will be clear after a moment's thought that the wall of the four frequency resonator 14 may be used advantageously to define the equivalent impedance and to use the consecutive step as an impedance transformer, thus increasing the area of the wave guide and decreasing the loss. This means, of course, that the smallest step in the pump impedance transformer 16 described is larger than would be the equivalent height of the pump input port for a rectangular guide matched with the same impedances. The formulas set out above would, however, still be applicable, it being necessary merely to consider the input port to take the place of the smallest step in the pump impedance transformer.

It should also be noted that the foregoing discussion of the principles underlying the design of the pump impedance transformer are equally applicable to the design of the signal impedance transformer 20 of FIG. 1. It is obvious, then, that the design of any signal impedance transformer may be accomplished by inserting appropriate values for the variables in the equations set forth above.

Figure 2:
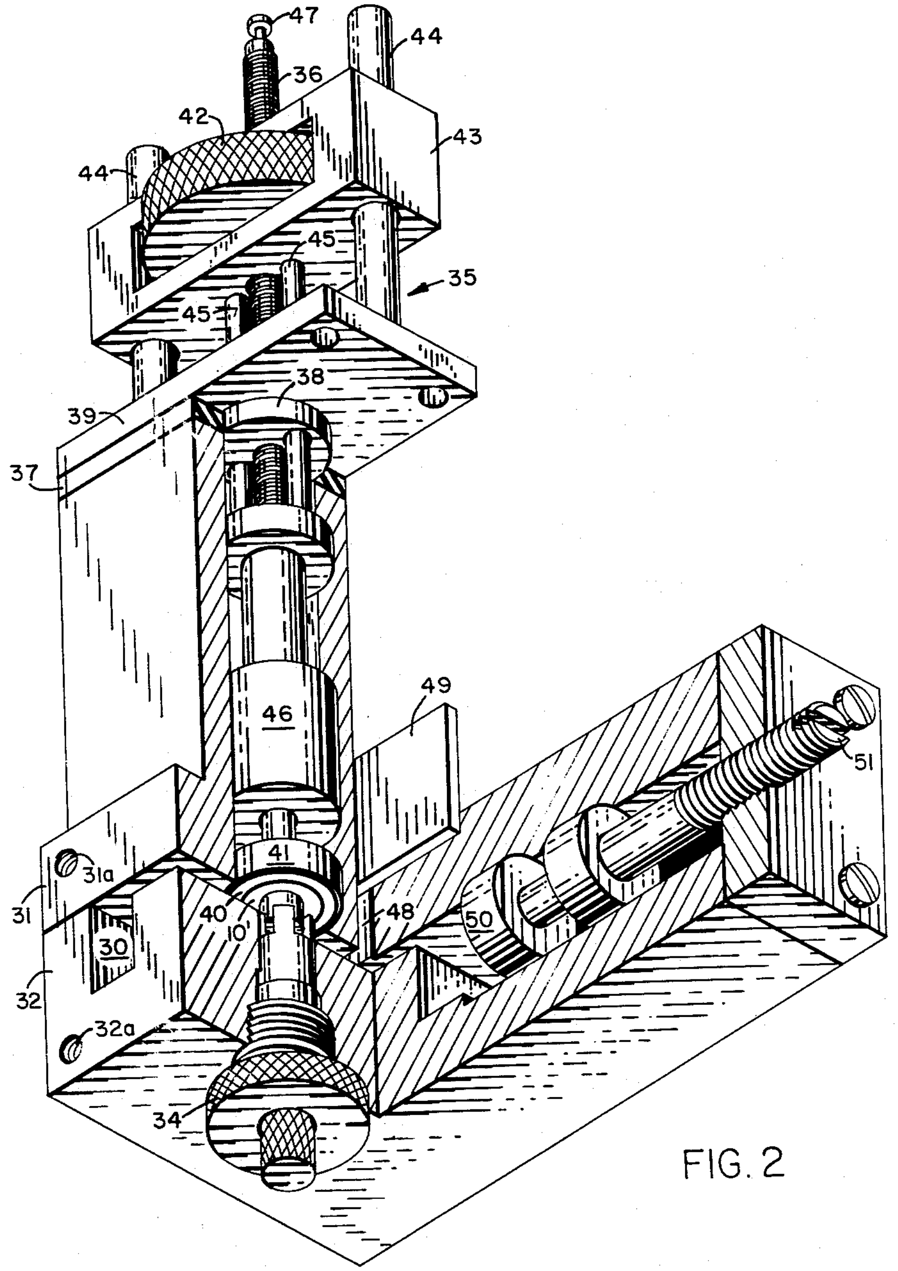
FIG. 2 is an isometric view, partially in section and somewhat distorted the better to illustrate constructional details of a resonator which may be used in the embodiment shown in FIG. 1, the resonator being adapted to support, simultaneously, standing fields at four different frequencies.
Figure 5:
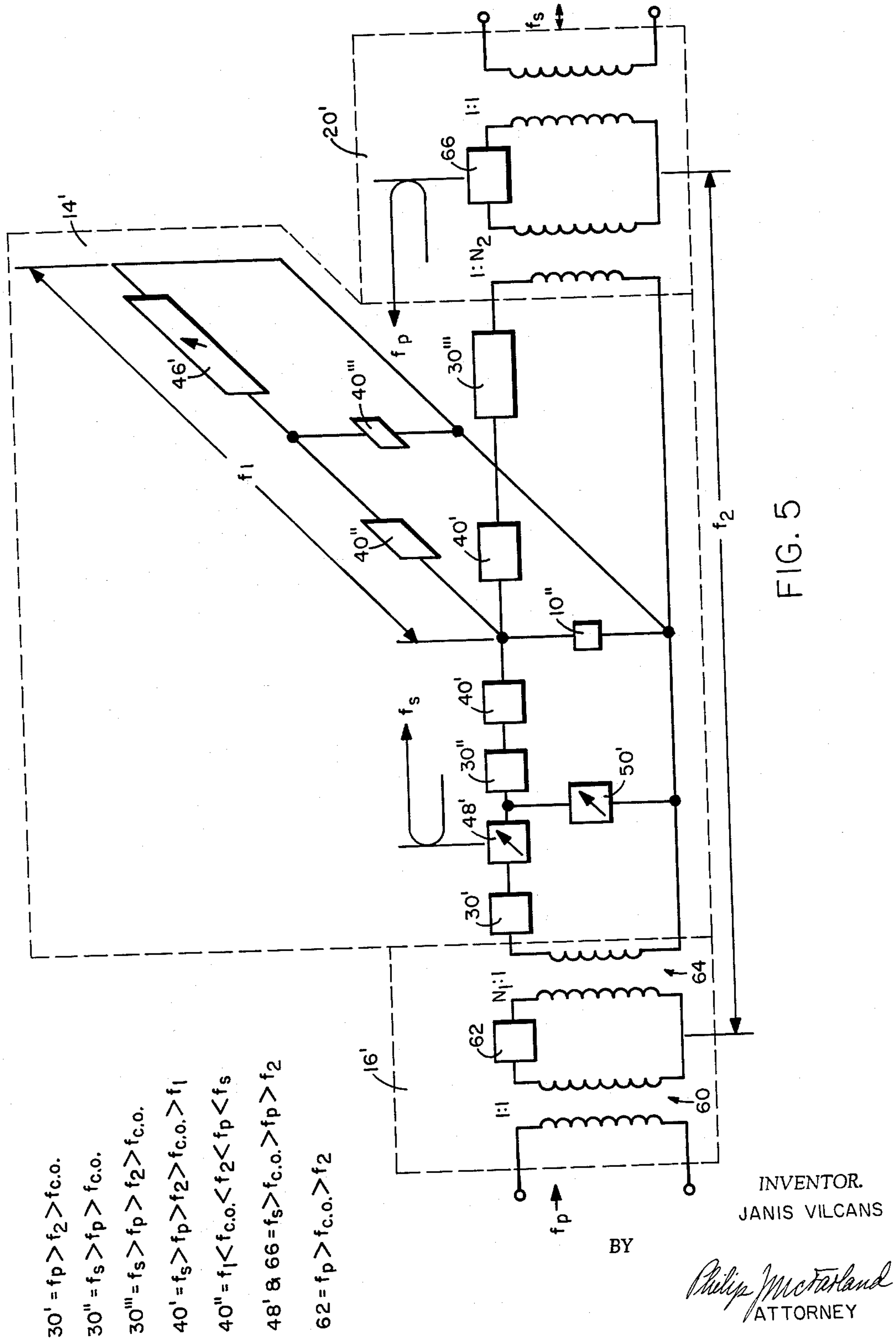
FIG. 5 is an equivalent circuit of the circuit shown in FIG. 1.

The elements of the equivalent circuit shown in FIG. 5 have been numbered to correspond with elements in FIGS. 1 and 2 in order to facilitate explanation. Thus, the filter and pump frequency impedance transformer 16 and the signal frequency impedance transformer 20 are, respectively, indicated by the elements within the blocks marked 16′ and 20′ and the four frequency resonator is represented by the dotted block 14′. The arrows marked $f_s$, $f_p$, $f_1$ and $f_2$ designate the portions of the circuit which effectively contribute to the support of standing waves of signals at, respectively, the signal frequency, the pump frequency, the first idler frequency ($f_s-f_p$) and the second idler frequency ($2f_p-f_s$).

The constant impedance steps of the pump impedance transformer are represented as a transformer 60 having a 1:1 ratio. The constant width steps of the pump impedance transformer are represented as a high pass filter 62 and a transformer 64 having an $N_1$:1 ratio. The high pass filter 62 has a cut-off frequency less than $f_p$ but greater than $f_2$. In other words the high pass filter 62 will propagate the pump frequency through the transformer but will reflect the second idler frequency. The ratio $N_1$:1 indicates the impedance ratio necessary to match, at the pump frequency, the impedance of the pump signal source to the varactor 10″. The signal impedance transformer 20′ is similar to the pump impedance transformer 16′ except that, in the ordinary case, the impedance ratio 1:$N_2$ of the signal impedance transformer 20′ differs from the impedance ratio $N_1$:1. Further, the cut-off frequency of the high-pass filter 66 of the former is greater than $f_p$ but less than $f_s$.

Elements 30′, 30″ and 30‴ represent portions of the ridge guide 30 between the various elements. Thus 30′ represents that portion of the ridge guide 30 between the pump input port and the slot 48 of FIG. 2, 30″ represents the portion of the ridge guide 30 between the slot 48 and the hole bored in the upper section 31 and 30‴ represents the portion of the ridge guide 30 between the hole bored in the upper section 31 and the signal input port. As noted, the ridge guide 30 is so proportioned that it will not permit propagation of higher frequencies of interest. Element 48′ represents the slot 48. The arrow within element 48′, in combination with the notation that the cut-off frequency of the element 48′ tunes only the signal frequency. Elements 40′ and 40″ represent the equivalent of the metallic ring 40 and the dieelectric ring 41 of FIG. 2. Thus, elements 40′ are the high pass filters for the second idler frequency, $2f_p-f_s$, and higher frequencies, while element 40″ is a low pass filter for the first idler frequency, $f_s-f_p$. Element 40‴ represents the susceptance of the combination of the metallic ring 40 and the dielectric ring 41 on the first idler frequency. Element 46′ represents terminating plug 46. The arrow in the element 46′ represents the fact that element 46′ is tunable. It is intended that adjustment of element 46′ affects only the first idler frequency, $f_s-f_p$. Element 50′ represents the tuning plug 50. The arrow in element 50′ represents the fact that tuning plug 50 may be adjusted. It should be noted in passing that, if the element 50′ were connected to the left of the element 48′, adjustment would affect only the second idler frequency.

With the foregoing description in mind, the operation of the preferred embodiment of this invention will become clear. A microwave signal to be amplified is applied to one port of the ridge guide (in FIG. 2, the port which is visible) and a pump signal is applied to the second port of the ridge guide. The frequency of the pump signal is less than the frequency of the microwave signal but greater than one half such frequency. The impedance of the circuit, looking from the varactor toward each port substantially matches the impedance of each source. The distance from the varactor to the signal input port is set so that, at the pump frequency, a standing wave (having substantially a voltage maximum at the varactor) is set up. The terminating bar 49 is adjusted so that a similar condition exists at the microwave signal frequency. Thus, both the pump and the microwave signals are coupled to the varactor. The two signals injected into the ridge guide beat together to form the first idler signal which has a frequency equal to the difference between the signal and the pump signal. When the combined upper varactor holder, varactor biasing voltage conductor and adjustable termination assembly is properly adjusted, a standing wave at the first idler frequency is set up in the hole bored in the upper section and is coupled to the varactor. The pump signal beats with the first idler signal to form the second idler signal. The ridge guide is dimensioned to support a standing wave at the second idler frequency coupled to the varactor and adjusted by the tuning plug 50. The various signals coupled to the varactor cause the reactance of that element to vary periodically to effect parametric amplification.

Figure 6:
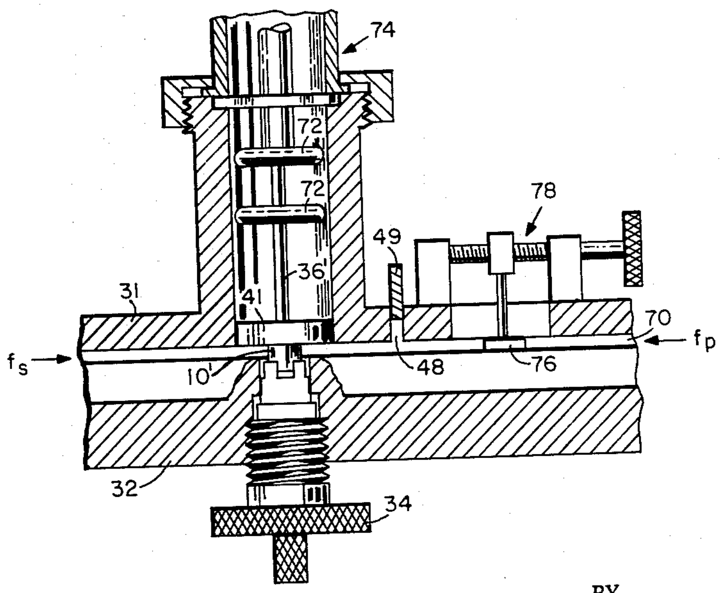
FIG. 6 is a cross-sectional view, somewhat simplified, of an alternative form of the resonator shown in FIG. 2.

The alternative embodiment of this invention which is shown in FIG. 6 is quite similar to the preferred embodiment. The now-to-be described embodiment is, however, well adapted to "down-conversion." It is understood that only required different elements are shown. In FIG. 6 a section of rectangular waveguide 70 may replace the ridge guide 30 of FIG. 2. The rectangular waveguide 70 is, however, so dimensioned as to cut-off the first idler frequency, $2f_s-f_p$, while supporting propagation of all higher frequencies of interest. The combined upper varactor holder, varactor biasing voltage conductor and adjustable termination assembly 35 is replaced by a metallic shaft 36′ on which number of metallic beads 72 are mounted to serve as a combined microwave frequency choke and termination for the first idler frequency coaxial cavity. A conventional coaxial line 74 is attached, as shown, to the first idler coaxial cavity with D.C. bias for the varactor applied through a conventional choke arrangement (not shown). A dielectric plug 76 having a length equal to an even integral multiple of one half the wavelength, in the rectangular wave guide 70, of the pump signal is movably disposed in the rectangular waveguide 70. The dielectric plug 76 is connected, through a slot (unnumbered) in the wall of the rectangular waveguide 70 to an adjusting assembly 78.

It will be noted that the dielectric plug 76 is located in a portion of the rectangular waveguide 70 wherein only the pump signal and the second idler signal are present. Since, however the length of the dielectric plug 76 is an even multiple of a half wavelength of the pump signal, the position of the dielectric plug has no effect on that signal. The position of the dielectric plug 76, however, does affect the tuning of the second idler signal.

Other modifications may be made without departing from the concepts of this invention. For example, the illustrated and described resonators may be replaced by other devices which accomplish the same end. That is the resonant properties of the varactor itself could be utilized in combination with properly designed and oriented dielectric, ferro-electric or ferri-magnetic materials may be used to support the required separately adjustable signals. In connection with tuning, it is evident that means in the microwave signal and pump signal feed lines may be provided. It is also evident that "image cancellation" techniques may be incorporated in the illustrated circuitry in series with the varactor to suppress unwanted sidebands. Further, it is evident that cryogenic techniques may be used to improve the noise figure of the illustrated amplifier.

While the invention has been described with particular reference to a parametric amplifier utilizing a so-called "low frequency" pump, a moment's thought will make it clear that the requirements of many other types of microwave circuits may be met using obvious modifications of the invention. For example, it is not required that the pump signal frequency be less than the microwave signal frequency. To put it another way, it is obvious that the pump frequency may be greater than the microwave signal frequency. In such an event only one of the idler frequencies ($f_p-f_s$) would be of interest if the resonator is to be used as a parametric amplifier. Further, it is obvious that the various frequencies in the illustrated embodiment be harmonics of each other so that the resonator may operate as a frequency multiplier. It is evident that, in such a case, only one input port would be required (the second input port and associated circuitry being eliminated). In connection with the use of the invention as a frequency multiplier, it should be noted especially that the number of cavities could very well be increased without departing from my inventive concepts. That is, additional cavities, each supporting a standing field at a different frequency, but, otherwise, similar to the cavity described for the first idler frequency could be used. It will be immediately evident to those having skill in the art that, whenever additional cavities are used, appropriate band-pass filters would be needed in place of the illustrated low-pass filter. It is felt, therefore, that the invention should not be restricted to its disclosed embodiments, but rather should be limited only by the spirit and scope of the appended claims.

What is claimed is:

1. A multi-idler parametric amplifier for a microwave signal wherein a microwave signal to be amplified is mixed with a pump signal having a frequency greater than one half the frequency of such microwave signal but less than the frequency thereof, comprising:
(a) means, including a resonator, for simultaneously supporting standing fields at frequencies, $f_s$, $f_p$, $f_s-f_p$, and $2f_p-f_s$, where $f_s$ equals the frequency of the microwave signal and $f_p$ equals the frequency of the pump signal;
(b) a varactor mounted in the resonator and coupled to the standing field at the frequency $f_p$;
(c) means for independently adjusting the standing fields at the frequencies $f_s$,$f_s-f_p$ and $2f_p-f_s$ to couple each such field to the varactor; and,
(d) means for extracting an amplified output signal from the resonator, said resonator comprising a length of ridge guide having a cut-off frequency greater than $f_s-f_p$ but less than $2f_p-f_s$, the microwave signal to be amplified being applied to one end of such guide and the pump signal being applied to the second end thereof, and a cavity orthogonally disposed with respect to the upper surface of the ridge guide, the longitudinal axis of the cavity coinciding with the longitudinal axis of the varactor; an adjustable band elimination filter having a cut-off frequency greater than $f_p$ but less than $f_s$ disposed between the varactor and the second end of the ridge guide to adjust, at $f_s$, the electrical length of the ridge guide; a first adjustable tuner coupled to the standing field at the frequency $2f_p-f_s$ between the varactor and the second end of the ridge guide at a null point in the standing field at the frequency $f_s$; a filter surrounding the varactor and filling the mouth of the cavity, the transmission band of such filter including $f_s-f_p$ but excluding $2f_p-f_s$; and a second adjustable tuner coacting with the cavity to set up therein a standing field at the frequency $f_s-f_p$.

2. An amplifier as in claim 1 having, additionally:
(a) a dielectric tuner movably mounted in the ridge guide between the band elimination filter and the second end of such guide, the length of such tuner being substantially equal to one-half the wavelength, in the ridge guide, of the pump signal; and,
(b) the first adjustable tuner is coupled to the ridge guide at any point between the varactor and the second end of such guide.

3. An amplifier as in claim 1 wherein:
(a) a first port is formed in the first end of the ridge guide, the cut-off frequency of such port being less than $f_s$ but greater than $f_p$;
(b) a second port is formed in the second end of the ridge guide, the cut-off frequency of such port being less than $f_p$ but greater than $2f_p-f_s$; and,
(c) the microwave signal to be amplified is applied to the first port and extracted therefrom, and the pump signal is applied to the second port.

4. An amplifier as in claim 3 having, additionally:
(a) a signal frequency impedance transformer and a high-pass filter connected to the first port, the cut-off frequency of such filter being less than $f_s$ but greater than $f_p$; and,
(b) a pump frequency impedance transformer and a high pass filter connected to the second port, the cut-off frequency of such filter being less than $f_p$ but greater than $2f_p-f_s$.

5. An amplifier as in claim 4 wherein the signal frequency impedance transformer and the pump frequency impedance transformer match, respectively, the impedance at the varactor, of the microwave signal source and the pump signal source to the impedance of the resonator.

References Cited by the Examiner

FOREIGN PATENTS 1,359,007 3/1964 France.
1,087,647 8/1960 Germany.

OTHER REFERENCES

Heggner et al., Proc. IRE, June 1958, page 1301.

ROY LAKE, *Primary Examiner.*

D. R. HOSTETTER, *Assistant Examiner.*